United States Patent
Lamey et al.

(10) Patent No.: US 7,589,370 B2
(45) Date of Patent: Sep. 15, 2009

(54) RF POWER TRANSISTOR WITH LARGE PERIPHERY METAL-INSULATOR-SILICON SHUNT CAPACITOR

(75) Inventors: Daniel J. Lamey, Phoenix, AZ (US); Xiaowei Ren, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 20 days.

(21) Appl. No.: 11/961,408

(22) Filed: Dec. 20, 2007

(65) Prior Publication Data

US 2008/0149981 A1    Jun. 26, 2008

Related U.S. Application Data

(60) Provisional application No. 60/871,114, filed on Dec. 20, 2006.

(51) Int. Cl.
    *H01L 29/94* (2006.01)
(52) U.S. Cl. .............................. 257/306; 257/E29.345
(58) Field of Classification Search ................. 257/306; 438/396
See application file for complete search history.

(56) References Cited

U.S. PATENT DOCUMENTS

| | | | | |
|---|---|---|---|---|
| 5,351,163 | A | | 9/1994 | Dawson et al. |
| 5,578,860 | A | * | 11/1996 | Costa et al. ................. 257/528 |
| 5,917,230 | A | * | 6/1999 | Aldrich ....................... 257/532 |
| 6,140,693 | A | * | 10/2000 | Weng et al. ................. 257/532 |
| 6,208,500 | B1 | * | 3/2001 | Alexander et al. .......... 361/303 |
| 6,331,931 | B1 | | 12/2001 | Titizian et al. |

OTHER PUBLICATIONS

Samavati et al., "Fractal Capacitors", Article, Dec. 1998, pp. 2035-2041, vol. 33, No. 12, IEEE Journal of Solid-State Circuits.

* cited by examiner

*Primary Examiner*—Zandra Smith
*Assistant Examiner*—Lawrence Tynes, Jr.
(74) *Attorney, Agent, or Firm*—Michael J. Balconi-Lamica; Robert L. King

(57) ABSTRACT

An integrated MIS capacitor structure has a bottom electrode, a capacitor dielectric overlying the bottom electrode, and a plurality of capacitor top plates overlying the capacitor dielectric. In one form each capacitor top plate has a principal dimension and a lesser dimension, wherein individual capacitor top plates of the plurality are arranged proximate and adjacent to one another in an array along respective principal dimensions thereof. The bottom electrode is shared among the plurality of capacitor top plates. At least one of a plurality of conductive stripes is positioned on opposite sides of each capacitor top plate along the principal dimension of a respective capacitor top plate. The structure also has a grounded top metal layer and an inter-level dielectric. An external ground via is disposed adjacent at least one side edge of the plurality of capacitor top plates.

20 Claims, 9 Drawing Sheets

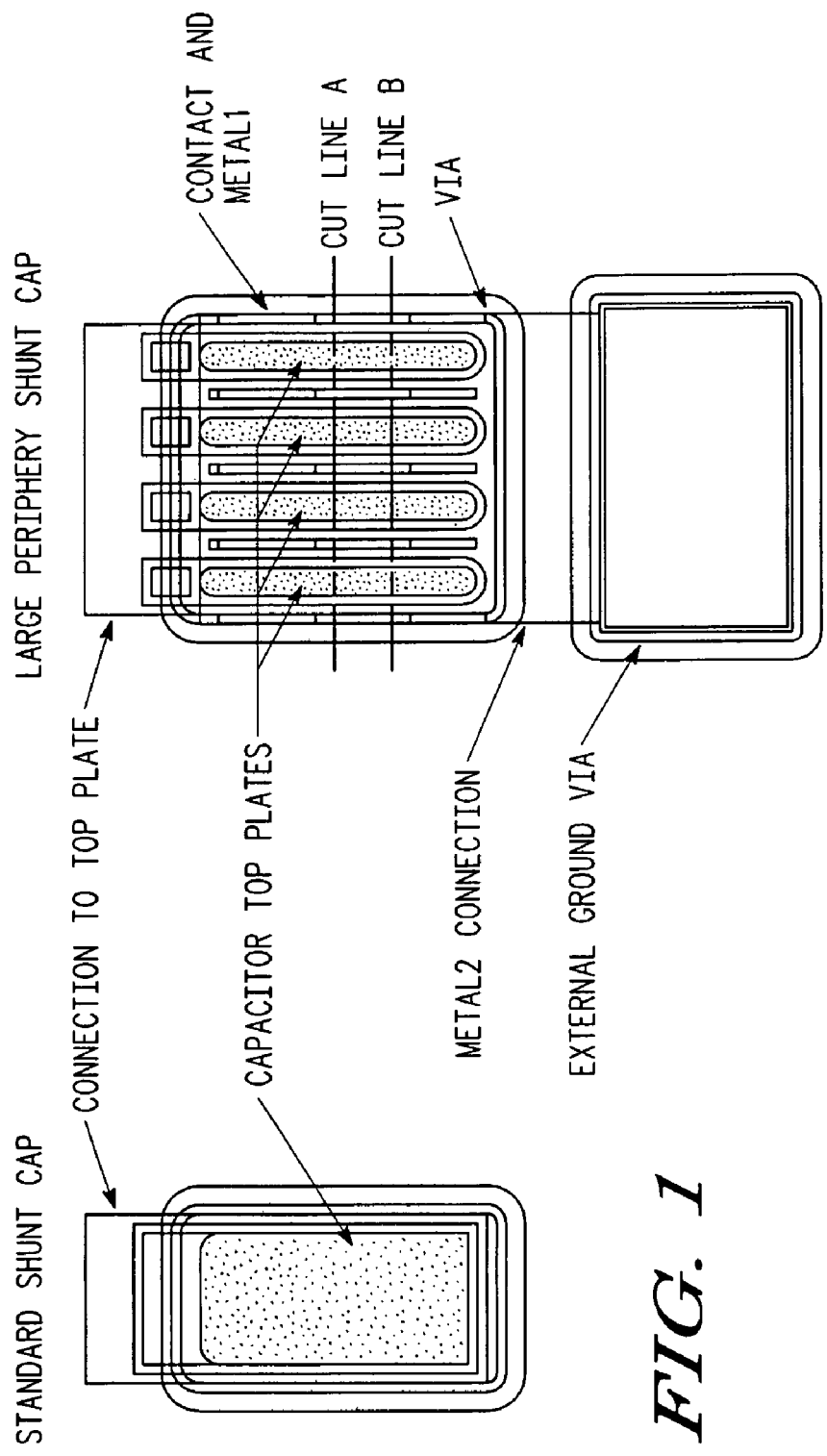

RF POWER TRANSISTOR WITH LARGE PERIPHERY METAL-INSULATOR-SILICON SHUNT CAPACITOR

CROSS-REFERENCE TO CO-PENDING APPLICATIONS

This application claims priority to provisional patent application Ser. No. 60/871,114 entitled "RF POWER TRANSISTOR WITH LARGE PERIPHERY METAL-INSULATOR-SILICON SHUNT CAPACITOR," filed on Dec. 20, 2006, and assigned to the assignee of the present application.

BACKGROUND

1. Field

This disclosure relates generally to RF devices, and more specifically, to an RF power transistor device with a large periphery Metal-Insulator-Silicon shunt capacitor and method thereof.

2. Related Art

RF transistor designs have traditionally included an integrated shunt capacitor design; however, the traditional integrated shunt capacitor has poor RF performance. In other words, such a traditional integrated shunt capacitor design degrades the RF power transistor's power, gain and efficiency. Such degradation in RF power transistor performance is especially noticeable in high power RF power transistor plastic package designs.

In a known high power RF device, wires and on-chip high Q metal-insulator-metal (MIM) shunt capacitors are used to achieve input and output matching of the high power RF devices. However, such MIM shunt capacitors are fabricated on a separate chip which has a refractory metal substrate. Accordingly, the MIM shunt capacitors are incompatible, and cannot be integrated, with LDMOS silicon based processes.

Furthermore, quality factor of a shunt capacitor is an important characteristic of an RF LDMOS power amplifier device. However, quality factor of devices that employ conventional rectangular shunt capacitor layouts is in need for improvement. That is, conventional rectangular shunt capacitor layouts for silicon substrates, specifically higher resistivity substrates, have resulted in lower Q capacitors.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 1 is a layout view of a standard MIS shunt capacitor known in the art;

FIG. 2 is a layout view of an MIS shunt capacitor configured with a large periphery according to one embodiment of the present disclosure;

DETAILED DESCRIPTION

Figure 3:
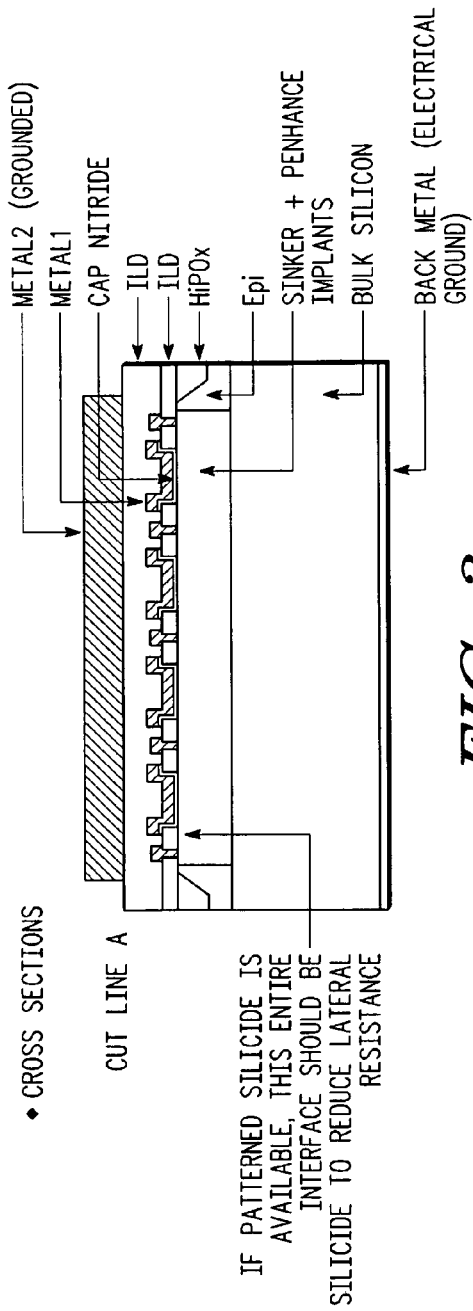
FIG. 3 is a cross-sectional view of the MIS shunt capacitor of FIG. 2 taken along line A of FIG. 2.

The embodiments according to the present disclosure provide a novel layout for metal-insulator-semiconductor (MIS) shunt capacitors, wherein the MIS shunt capacitor layout improves the quality factor (denoted "Q") of the MIS shunt capacitor over conventional rectangular MIS shunt capacitor layouts. In other words, the MIS shunt capacitor according to the embodiments of the present disclosure advantageously reduces the undesirable resistive losses of shunt capacitors in integrated circuits with high resistivity substrates.

According to one embodiment of the present disclosure, a metal-insulator-semiconductor (MIS) shunt capacitor comprises an MIS output matching shunt capacitor having a large periphery and having portions disposed proximate metal that is coupled to ground through an external ground via. Such a configuration facilitates charging of the capacitor bottom plate laterally with a lateral current flow, in addition to charging with a vertical current flow.

By providing a parallel path for charging the bottom capacitor plate through surrounding metal to an external ground via, losses in the capacitor are advantageously reduced. The MIS shunt capacitor according to the embodiments of the present disclosure can be applied to any high conductivity substrate integrated circuit process. In one embodiment, the MIS output matching shunt capacitor is implemented on a high conductivity substrate.

As described herein, semiconductor can be any semiconductor material or combinations of materials, such as gallium arsenide, silicon germanium, silicon-on-insulator (SOI), silicon, monocrystalline silicon, the like, and combinations of the above.

As used herein quality factor Q refers to a measure of energy efficiency of a device, and more particularly, a ratio of energy stored in a device divided by the energy consumed by the device. For example, if Q=10 for a given RF device, then the RF device stores 10 times more energy in the device than is being consumed by the device per RF cycle. If Q=100 for a given RF device, then the device consumes 1 percent of the energy per RF cycle. It would be desirable to attain a Q having a high number so that a high efficiency in an RF power amplifier can be achieved. In one embodiment, a capacitor of 20-40 pf with a Q on the order of 20 or greater is desired. Stated in a different manner, quality factor can be expressed as the imaginary part of the input impedance of an RF capacitor divided by the real part of input impedance of the RF capacitor.

FIG. 1 is a layout view of a standard MIS shunt capacitor known in the art. FIG. 2 is a layout view of an MIS shunt capacitor configured with a large periphery according to one embodiment of the present disclosure. While the surface area of the capacitor top plate of the capacitor of FIG. 1 is approximately the same as the collective surface area of the capacitor top plates of the capacitor of FIG. 2, the effective total periphery of the shunt capacitor of FIG. 2 is larger than that of the periphery of the capacitor of FIG. 1. Various elements of FIGS. 1 and 2 are identified directly on the respective figures.

Figure 4:
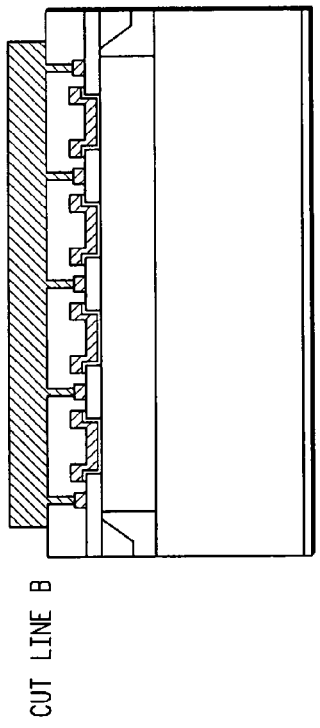
FIG. 4 is a cross-sectional view of the MIS shunt capacitor of FIG. 2 taken along line B of FIG. 2.

FIG. 3 is a cross-sectional view of the MIS shunt capacitor of FIG. 2 taken along line A of FIG. 2. Various elements of FIG. 3 are identified directly on the figure. In an alternate embodiment, a patterned silicide is disposed along the interface between the sinker and P+ enhanced implant regions and the overlying cap nitride. For example, a silicide can be disposed in between the capacitor dielectric and the highly doped bottom electrode. In addition, the silicide may overlie a surface of the highly doped bottom electrode directly underlying the capacitor dielectric and/or interlevel dielectric. FIG. 4 is a cross-sectional view of the MIS shunt capacitor of FIG. 2 taken along line B of FIG. 2. In FIG. 4, vias are illustrated which couple grounded Metal2 to Metal1 traces located between capacitor top plates and proximate outer ones of the capacitor top plates.

With reference still to FIGS. 3 and 4, the bottom electrode includes a doped epitaxial layer overlying a bulk semiconductor substrate, further overlying a back metal of the substrate. In one embodiment, the doped epitaxial layer comprises a heavily doped sinker and P+ enhanced implant region. In addition, the capacitor dielectric overlies the bottom electrode. In one embodiment, the capacitor dielectric comprises a patterned capacitor dielectric that overlies the bottom electrode in regions underlying each of the plurality of individual capacitor top plates alone.

The plurality of capacitor top plates overlie the capacitor dielectric (or respective portions of capacitor dielectric), each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates. In one embodiment, the capacitor top plates of the plurality of capacitor top plates comprise similar capacitor top plates. In another embodiment, the capacitor top plates of the plurality of capacitor top plates comprise a portion of which are dissimilar to other ones of the capacitor top plates. Still further, dissimilar ones of the capacitor top plates can each include at least one bend in the capacitor top plate along its corresponding principal dimension, wherein a bend corresponds to the principal dimension traversing along more than one direction (e.g., as discussed further herein with respect to FIG. 9).

With reference to FIGS. 2, 3, and 4, each capacitor top plate can be characterized as having a given periphery. The plurality of capacitor top plates are further configured to provide for a given cumulative capacitance value. In addition, the capacitor top plates of the plurality taken together collectively form a large periphery capacitor which occupy an area having an area periphery on the order of a capacitor top plate periphery for a single capacitor top plate MIS shunt capacitor (e.g., FIG. 1) of an equivalent capacitance value, the single capacitor top plate MIS shunt capacitor thereby comprising a small periphery capacitor in comparison to the large periphery capacitor of the plurality of capacitor top plates.

The integrated large periphery MIS shunt capacitor further includes a plurality of conductive stripes, wherein at least one conductive stripe is positioned on opposite sides of each capacitor top plate along the principal dimension of a respective capacitor top plate. In one embodiment, the capacitor top plates and the plurality of conductive stripes (also referred to as contact stripes) are formed of a first metal (Metal 1), and the vias and grounded top metal are formed of a second metal (Metal 2). In another embodiment, a single conductive stripe is shared between adjacent ones of the plurality of capacitor top plates except for first and last conductive stripes positioned before a first of the plurality of capacitor top plates and a last of the plurality of capacitor top plates, respectively, as illustrated in FIGS. 3 and 4. The plurality of conductive stripes is electrically coupled between the bottom electrode and the grounded top metal layer and advantageously provide for a shortest lateral path to ground of any point in a region of the bottom electrode underlying a given capacitor top plate of the plurality of capacitor top plates. In one embodiment, the shortest lateral path to ground comprises a distance on the order of less or equal to fifty percent of a lateral distance across the bottom electrode spanning from a first capacitor top plate of the plurality to a last capacitor top plate of the plurality.

The integrated large periphery MIS shunt capacitor further includes a grounded top metal layer overlying a portion of the plurality of capacitor top plates, wherein each of the plurality of conductive stripes is coupled between the bottom electrode and the grounded top metal layer. In one embodiment, a portion of the plurality of capacitor top plates not underlying the grounded top metal layer (FIGS. 2, 9 and 10) is available for electrical connection to the plurality of capacitor top plates, and the integrated MIS shunt capacitor further comprises a contact top metal layer electrically coupled to the plurality of capacitor top plates. An inter-level dielectric is also provided, wherein the inter-level dielectric is configured to (i) isolate the plurality capacitor top plates from the grounded top metal layer, and (ii) isolate the plurality of conductive stripes from adjacent ones of the plurality of capacitor top plates.

Figure 5:
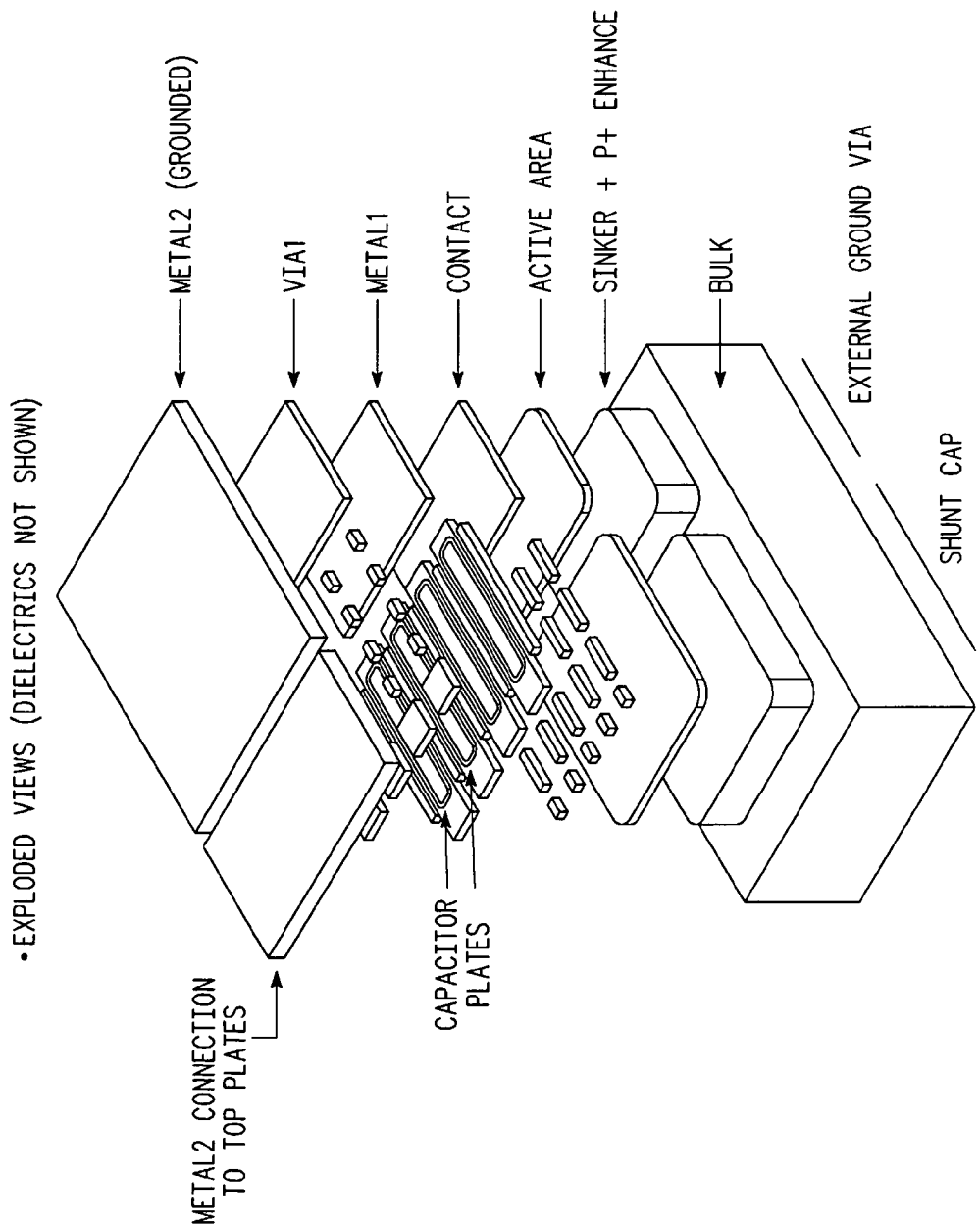
FIG. 5 is an exploded view of a MIS shunt capacitor according to one embodiment of the present disclosure.
Figure 6:
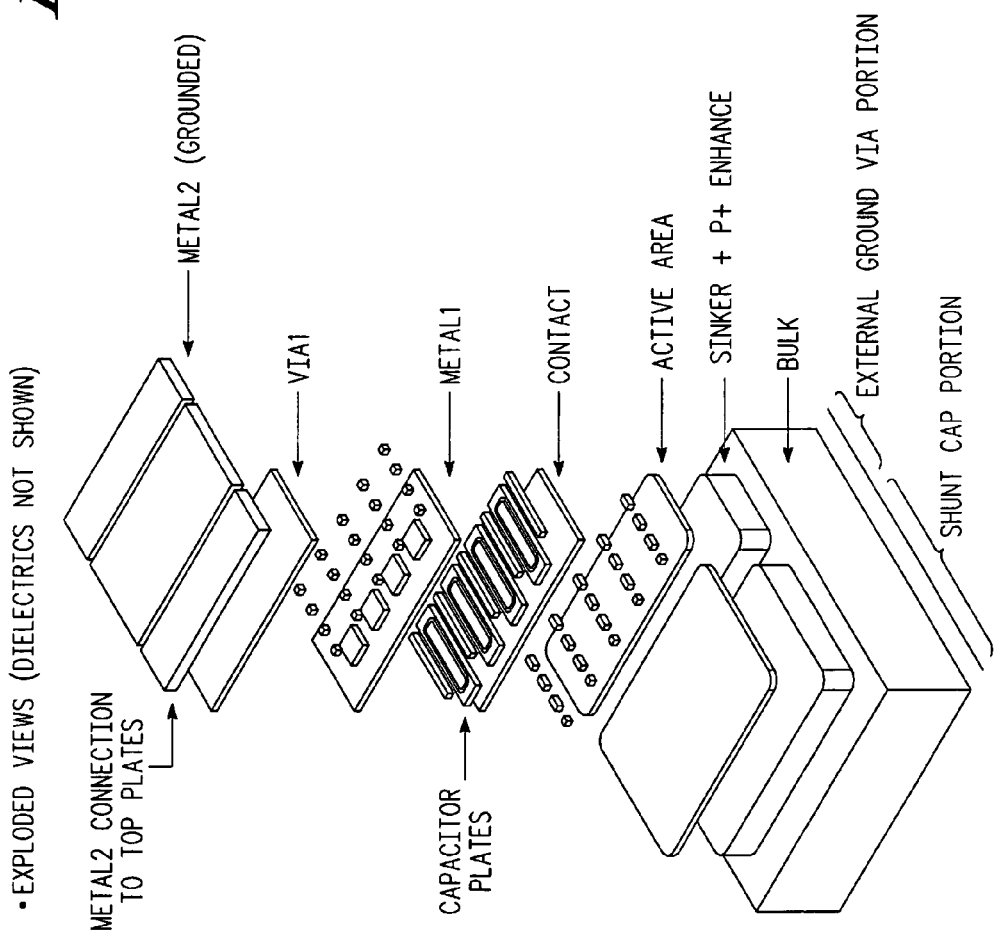
FIG. 6 is an exploded view of the MIS shunt capacitor of FIG. 5 according to one embodiment of the present disclosure, as viewed from a different angle.

FIG. 5 is an exploded view of a MIS shunt capacitor according to one embodiment of the present disclosure. Various elements of FIG. 5 are identified directly on the figure. FIG. 6 is an exploded view of the MIS shunt capacitor of FIG. 5 according to one embodiment of the present disclosure, as viewed from a different angle. Various elements of FIG. 6 are identified directly on the figure.

The external ground via (FIGS. 2, 5 and 6) is disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via. In one embodiment, the external ground via surrounds three side edges of the plurality of capacitor top plates, collectively (as will be discussed further herein with respect to FIGS. 9 and 10). In another embodiment, the doped epitaxial layer of the external ground via comprises a heavily doped sinker and P+ enhanced implant region.

Figure 7:
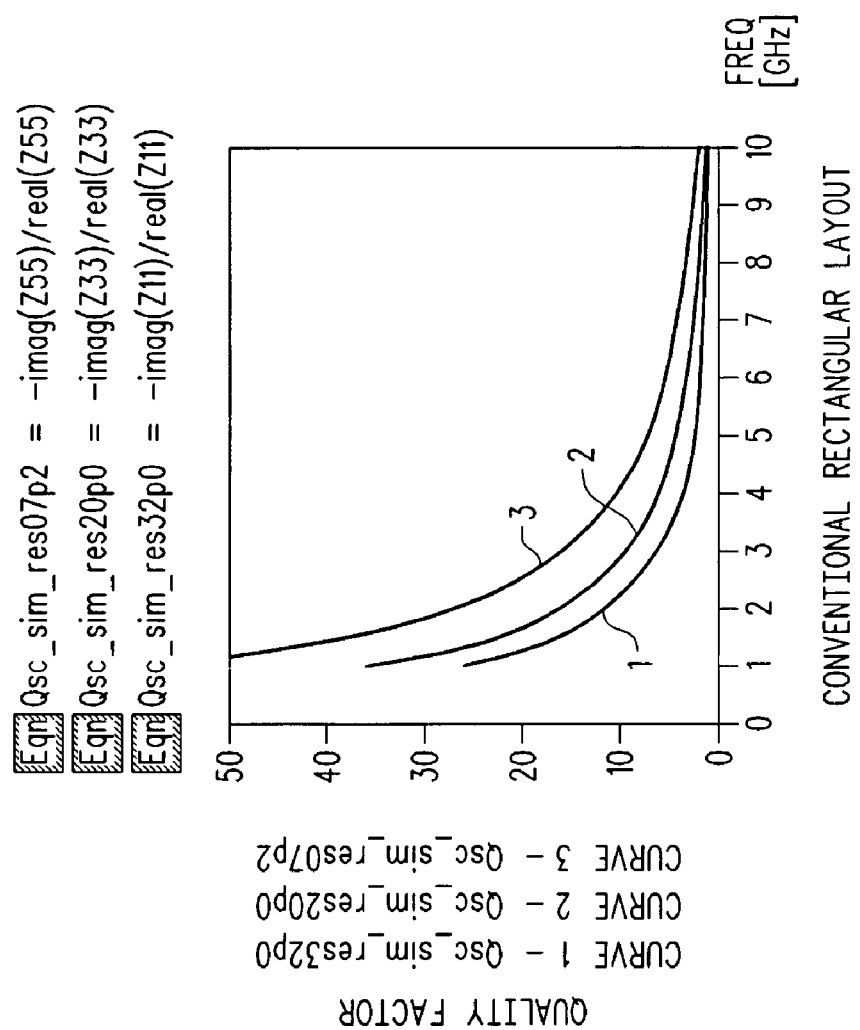
FIG. 7 is a graphical plot view of simulation data for an MIS shunt capacitor having a conventional rectangular layout.
Figure 8:
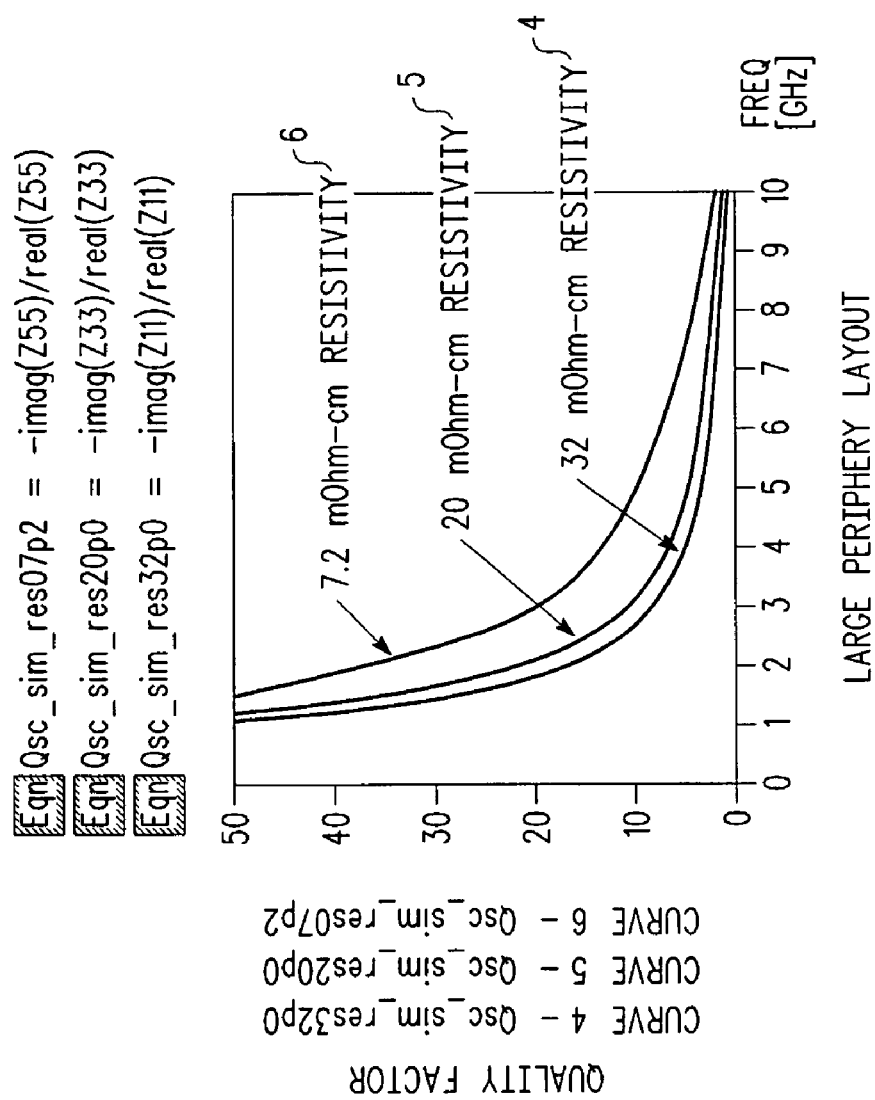
FIG. 8 is a graphical plot view of simulation data for an MIS shunt capacitor having a large periphery layout according to the embodiments of the present disclosure.

Electromagnetic simulations were conducted for an MIS shunt capacitor having a conventional rectangular layout and for an MIS shunt capacitor having a large periphery according to the embodiments of the present disclosure, for various substrate resistivities. Plots of quality factor (Q) versus frequency (GHz) were generated. FIG. 7 is a graphical plot view of simulation data for the MIS shunt capacitor having a conventional rectangular layout. FIG. 8 is a graphical plot view of simulation data for the MIS shunt capacitor having a large periphery layout according to the embodiments of the present disclosure. Comparing the results of FIG. 7 with those of FIG. 8, the predicted improvement in Q ranges from 25% to 60% depending on substrate resistivity.

Figure 9:
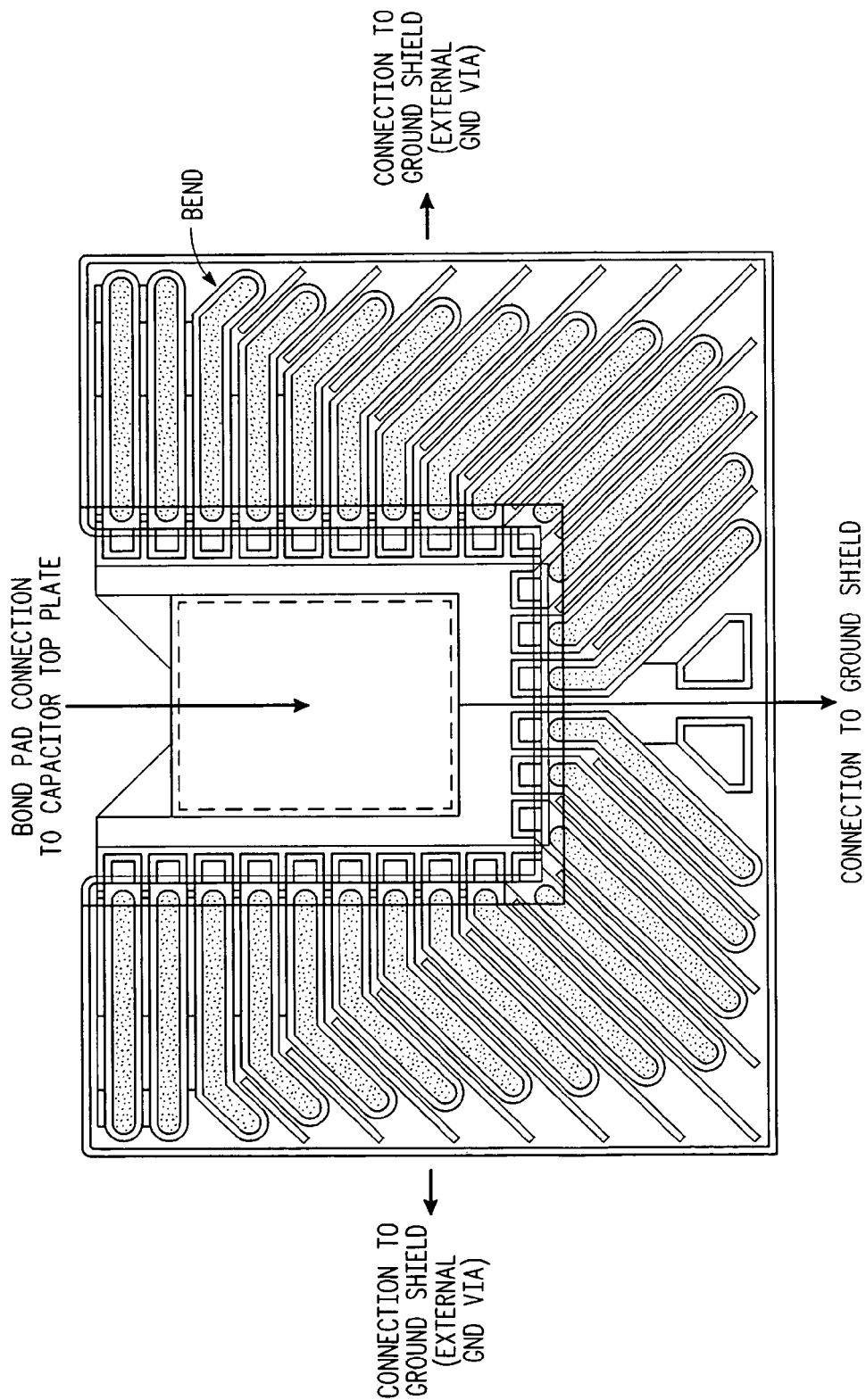
FIG. 9 is a layout view of an MIS shunt capacitor configured with a large periphery according to another embodiment of the present disclosure.

FIG. 9 is a layout view of an MIS shunt capacitor configured with a large periphery according to another embodiment of the present disclosure. In particular, FIG. 9 illustrates a portion of one implementation of an RF device that includes a MIS shunt capacitor configured with a large periphery. In addition, in the embodiment of FIG. 9, select ones of the capacitor plates include bends (e.g., "bending" of capacitor plates in the layout) configured to increase a cap-to-cap space, increase a total area, and reduce a vertical component of resistance for the MIS shunt capacitor with large periphery. Various elements of FIG. 9 are identified directly on the figure.

Figure 10:
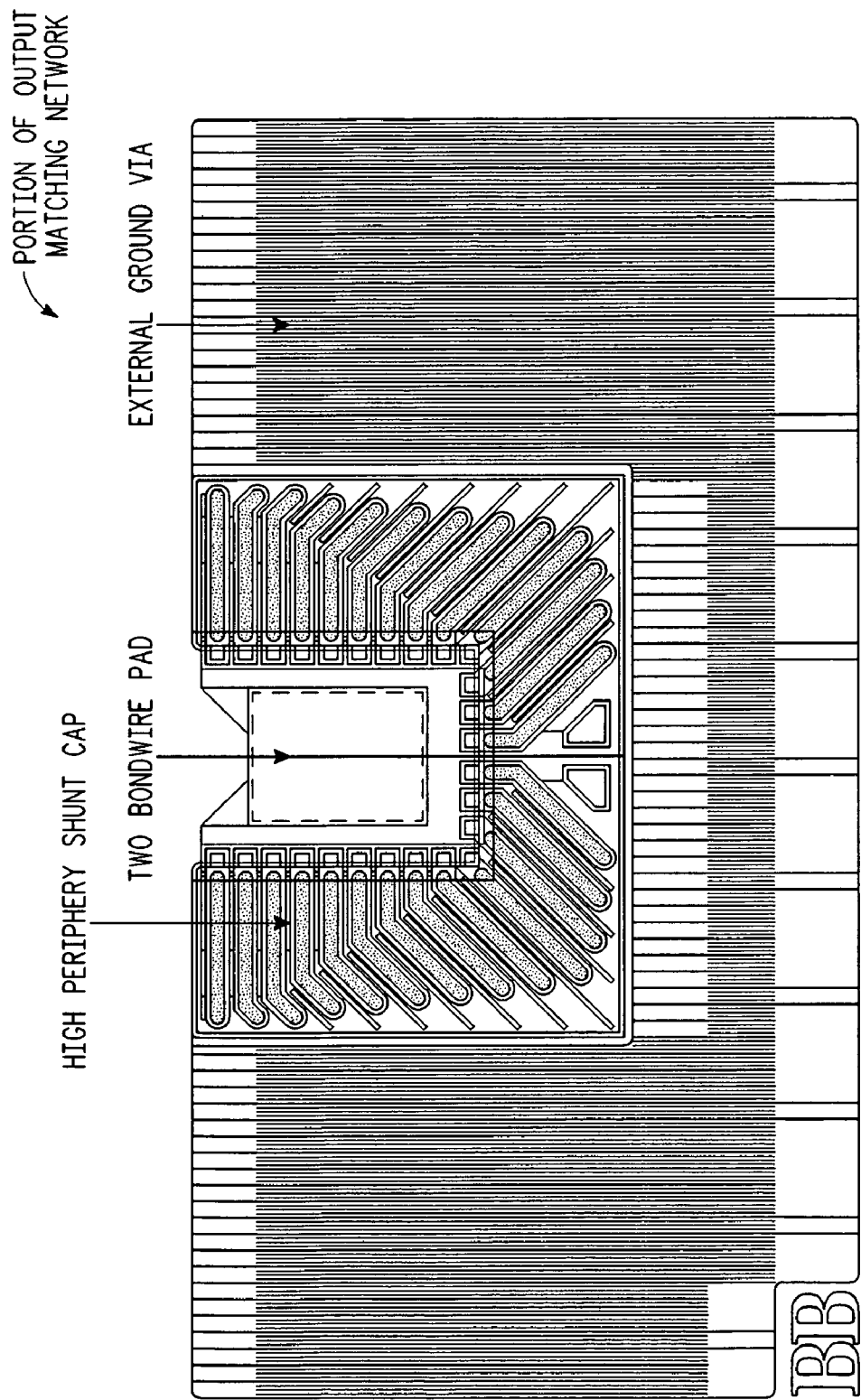
FIG. 10 is a further layout view of an MIS shunt capacitor configured with a large periphery according to one embodiment of the present disclosure.
Figure 11:
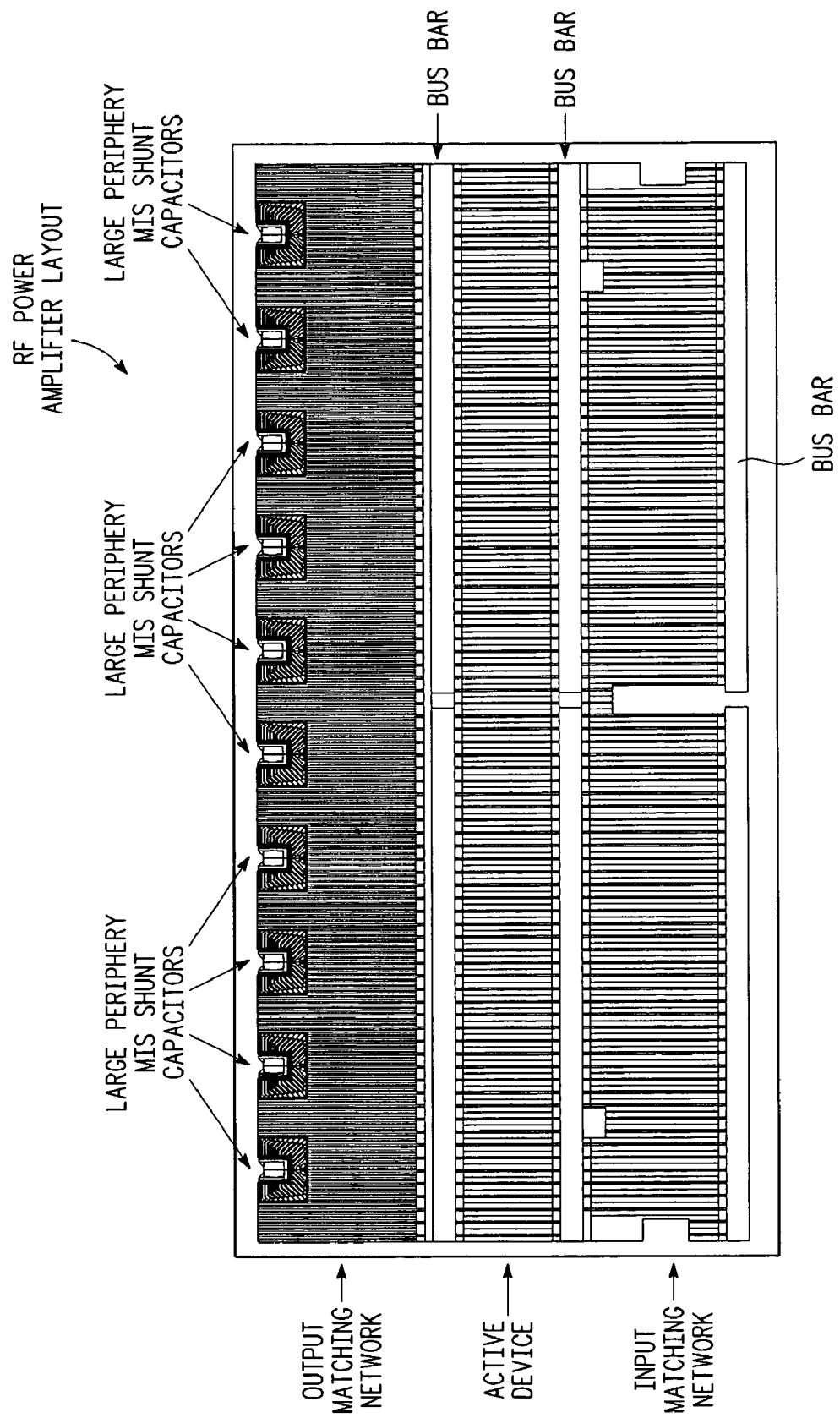
FIG. 11 is a layout view of an RF power transistor featuring a plurality of MIS shunt capacitors configured with large periphery according to the embodiments of the present disclosure.

FIG. 10 is a further layout view of an MIS shunt capacitor configured with a large periphery in a portion of an output matching network according to one embodiment of the present disclosure. FIG. 11 is a layout view of an RF power transistor (or RF power amplifier layout) featuring a plurality of MIS shunt capacitors configured with large periphery according to the embodiments of the present disclosure. Various elements of FIGS. 10 and 11 are identified directly on the respective figure.

According to one embodiment, a large periphery Metal-Insulator-Silicon (MIS) shunt capacitor reduces silicon losses for higher RF performance. The capacitor comprises an MIS structure, with a highly doped silicon bottom plate and a highly doped substrate, wherein the highly doped substrate provides a direct connection to a backside metal ground connection. The capacitor is configured to include a large periphery so that the distance from any point on the bottom plate of the capacitor to an edge (i.e., proximate a conductive stripe) is within a predetermined distance, wherein the predetermined distance is selected according to a desired performance characteristic of a given MIS shunt capacitor application.

In one embodiment, the distance is "small". Furthermore, metal contacts are formed proximate the capacitor periphery and associated metal is routed to an external ground via. This provides for an additional, parallel conduction path for the bottom plate charge.

In one embodiment, the MIS capacitor plates are configured with large periphery-to-area ratio, with grounded metal (e.g., conductive stripes) laterally surrounding each capacitor top plate and contacting both silicon (e.g., the bottom electrode) and a top metal ground plane. The grounded metal extends to external ground vias, wherein the grounded metal and external ground vias advantageously provide a low impedance path to ground. The MIS capacitor structure also features a layout configured to maintain a distance traveled by current from bond wires (or associated bond pads) to the capacitor as small as possible, resulting in less eddy current loss. Accordingly, the effective area occupied by the MIS capacitor is increased, which reduces vertical shunt resistance to ground.

As used herein, the term large periphery can be better understood in connection with the following discussion. Let's compare the periphery of the MIS shunt capacitors according to the present embodiments to that of a square capacitor with the same capacitor area. For example, let's suppose we are talking about capacitors that have an area of 10,000 sq. μm. In addition, let's say we want to compare a capacitor that is 10 times longer in one dimension than it is wide in another dimension to a square cap. Under these conditions, it turns out that the dimensions of the long capacitor are 316.2 μm by 31.62 μm, and the ratio of the perimeter of the long capacitor to the perimeter of the square capacitor is given by:

$$\text{perimeter long cap/perimeter square cap} = (695.7\ \mu m)/(400\ \mu m) = 1.739$$

This number is independent of the units used to measure the two caps.

In line with the above discussion, a "Periphery-to-Square Cap Periphery" ratio provides a reasonably good manner to categorize the capacitors. Even for a very narrow capacitor, such as a 447 μm×22.4 μm case, that ratio amounts to a value of 2.35. For one category of capacitors, the "Periphery-to-Square Cap Periphery" ratio includes a number having a value in the range of about 8 to 12. For another category of capacitors, the "Periphery-to-Square Cap Periphery" ratio can have a value of 3. Furthermore, a ratio having a value of 4 or higher provides an indication that the corresponding capacitor comprises a capacitor designed to have a "large" periphery. For capacitors having multiple capacitor top plate segments, the periphery is determined by the sum of the peripheries of each segment.

The MIS shunt capacitor according to the embodiments of the present disclosure advantageously mitigates losses in higher resistivity substrates, in addition to having an improving performance over prior known capacitors. In other words, the MIS shunt capacitor of the present disclosure improves the quality factor over conventional rectangular capacitor layouts. Furthermore, improving the quality factor of the output match capacitors produces enhanced performance of single chip RF LDMOS power amplifiers.

By now it should be appreciated that there has been provided an MIS capacitor structure comprising a high quality factor shunt capacitor. The MIS capacitor is configured with a large periphery and an external ground via to mitigate resistive losses in the bottom plate of the MIS shunt capacitor. Accordingly, the MIS capacitor of the embodiments of the present disclosure provides high quality factor shunt capacitors for RF power applications, such as an output matching circuit of RF LDMOS power amplifiers. In one embodiment, an integrated MIS shunt capacitor includes a bottom plate that comprises grounded silicon.

By now it should be further appreciated that there has been provided an integrated metal-insulator-semiconductor (MIS) shunt capacitor comprises a bottom electrode; a capacitor dielectric overlying the bottom electrode; a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates; a plurality of conductive stripes, wherein at least one conductive stripe is positioned on opposite sides of each capacitor top plate along the principal dimension of a respective capacitor top plate; a grounded top metal layer overlying a portion of the plurality of capacitor top plates, wherein each of the plurality of conductive stripes is coupled between the bottom electrode and the grounded top metal layer; and an inter-level dielectric, wherein the inter-level dielectric is configured to (i) isolate the plurality capacitor top plates from the grounded top metal layer, and (ii) isolate the plurality of conductive stripes from adjacent ones of the plurality of capacitor top plates.

In one embodiment, the bottom electrode includes a doped epitaxial layer overlying a bulk semiconductor substrate, further overlying a back metal of the substrate. The doped epitaxial layer comprises a heavily doped sinker and P+ enhanced implant region. In addition, the capacitor dielectric can comprise a patterned capacitor dielectric that overlies the bottom electrode in regions underlying each of the plurality of individual capacitor top plates alone.

In another embodiment, the capacitor top plates of the plurality of capacitor top plates comprise similar capacitor top plates. In yet another embodiment, the capacitor top plates of the plurality of capacitor top plates comprise a portion of which are dissimilar to other ones of the capacitor top plates. The dissimilar ones of the capacitor top plates each include at least one bend in the capacitor top plate along its corresponding principal dimension, wherein a bend corresponds to the principal dimension traversing along more than one direction.

In another embodiment of the integrated MIS shunt capacitor, each capacitor top plate is characterized as having a given periphery, wherein the plurality of capacitor top plates are further configured to provide for a given cumulative capacitance value, and still further wherein the capacitor top plates of the plurality taken together collectively form a large periphery capacitor which occupy an area having an area periphery on the order of a capacitor top plate periphery for a single capacitor top plate MIS shunt capacitor of an equivalent capacitance value, the single capacitor top plate MIS shunt capacitor thereby comprising a small periphery capacitor in comparison to the large periphery capacitor of the plurality of capacitor top plates.

According to another embodiment of the integrated MIS shunt capacitor, a single conductive stripe is shared between adjacent ones of the plurality of capacitor top plates except for first and last conductive stripes positioned before a first of the plurality of capacitor top plates and a last of the plurality of capacitor top plates, respectively. In addition, the plurality of conductive stripes are electrically coupled between the bottom electrode and the grounded top metal layer to provide for a shortest lateral path to ground of any point in a region of the bottom electrode underlying a given capacitor top plate of the plurality of capacitor top plates. In one embodiment, the shortest lateral path to ground comprises a distance on the order of less or equal to fifty percent of a lateral distance across the bottom electrode spanning from a first capacitor top plate of the plurality to a last capacitor top plate of the plurality.

According to a further embodiment, a portion of the plurality of capacitor top plates not underlying the grounded top metal layer is available for electrical connection to the plurality of capacitor top plates. In such an embodiment, the integrated MIS shunt capacitor further comprises a contact top metal layer electrically coupled to the plurality of capacitor top plates. In another embodiment, the capacitor top plates and the contact stripes are formed of a first metal (e.g., M1), and wherein the vias and grounded top metal are formed of a second metal (e.g., M2).

In one embodiment, the integrated MIS shunt capacitor further comprises an external ground via disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via. In another embodiment, the external ground via surrounds three side edges of the plurality of capacitor top plates, collectively. Furthermore, the doped epitaxial layer of the external ground via can comprise a heavily doped sinker and P+ enhanced implant region. In a still further embodiment, the integrated MIS shunt capacitor further comprises a silicide disposed in between the capacitor dielectric and the highly doped bottom electrode. The integrated MIS shunt capacitor can comprise a portion of a matching network for an integrated power amplifier device.

According to another embodiment, an integrated metal-insulator-semiconductor (MIS) shunt capacitor comprises: a bottom electrode; a capacitor dielectric overlying the bottom electrode; a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates; a plurality of conductive stripes, wherein at least one conductive stripe is positioned on opposite sides of each capacitor top plate along the principal dimension of a respective capacitor top plate; a grounded top metal layer overlying a portion of the plurality of capacitor top plates, wherein each of the plurality of conductive stripes is coupled between the bottom electrode and the grounded top metal layer; an inter-level dielectric, wherein the inter-level dielectric is configured to (i) isolate the plurality capacitor top plates from the grounded top metal layer, and (ii) isolate the plurality of conductive stripes from adjacent ones of the plurality of capacitor top plates; and an external ground via disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via, wherein each capacitor top plate is characterized as having a given periphery, further wherein the plurality of capacitor top plates are further configured to provide for a given cumulative capacitance value, and still further wherein the capacitor top plates of the plurality taken together collectively form a large periphery capacitor which occupy an area having an area periphery on the order of a capacitor top plate periphery for a single capacitor top plate MIS shunt capacitor of an equivalent capacitance value, the single capacitor top plate MIS shunt capacitor thereby comprising a small periphery capacitor in comparison to the large periphery capacitor of the plurality of capacitor top plates.

In a still further embodiment, an integrated metal-insulator-semiconductor (MIS) shunt capacitor comprises: a bottom electrode; a capacitor dielectric overlying the bottom electrode; a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates; a plurality of conductive stripes, wherein at least one conductive stripe is positioned on opposite sides of each capacitor top plate along the principal dimension of a respective capacitor top plate; a grounded top metal layer overlying a portion of the plurality of capacitor top plates, wherein each of the plurality of conductive stripes is coupled between the bottom electrode and the grounded top metal layer; an inter-level dielectric, wherein the inter-level dielectric is configured to (i) isolate the plurality capacitor top plates from the grounded top metal layer, and (ii) isolate the plurality of conductive stripes from adjacent ones of the plurality of capacitor top plates; an external ground via disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via, wherein a portion of the plurality of capacitor top plates not underlying the grounded top metal layer is available for electrical connection to the plurality of capacitor top plates; and a contact top metal layer electrically coupled to the plurality of capacitor top plates, wherein a single conductive stripe is shared between adjacent ones of the plurality of capacitor top plates except for first and last conductive stripes positioned before a first of the plurality of capacitor top plates and a last of the plurality of capacitor top plates, respectively, further wherein the plurality of conductive stripes electrically coupled between the bottom electrode and the grounded top metal layer provide for a shortest lateral path to ground of any point in a region of the bottom electrode underlying a given capacitor top plate of the plurality of capacitor top plates, and still further wherein the shortest lateral path to ground comprises a distance on the order of less or equal to fifty percent of a lateral distance across the bottom electrode spanning from a first capacitor top plate of the plurality to a last capacitor top plate of the plurality.

Because the apparatus implementing the present invention is, for the most part, composed of transistor components known to those skilled in the art, certain transistor details will not be explained in any greater extent than that considered necessary as illustrated above, for the understanding and appreciation of the underlying concepts of the present invention and in order not to obfuscate or distract from the teachings of the present invention.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Although the invention is described herein with reference to specific embodiments, various modifications and changes can be made without departing from the scope of the present invention as set forth in the claims below. For example, the embodiments of the present disclosure can be used to provide performance improvements to multiple generations of advanced RF-LDMOS integrated circuit devices, as well as, any semiconductor technology using high Q factor shunt capacitors. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated metal-insulator-semiconductor (MIS) shunt capacitor comprising:
    a bottom electrode;
    a capacitor dielectric overlying the bottom electrode;
    a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates;
    a plurality of conductive stripes, wherein at least one conductive stripe is positioned on opposite sides of each capacitor top plate along the principal dimension of a respective capacitor top plate;
    a grounded top metal layer overlying a portion of the plurality of capacitor top plates, wherein each of the plurality of conductive stripes is coupled between the bottom electrode and the grounded top metal layer;
    an inter-level dielectric, wherein the inter-level dielectric is configured to (i) isolate the plurality of capacitor top plates from the grounded top metal layer, and (ii) isolate the plurality of conductive stripes from adjacent ones of the plurality of capacitor top plates; and
    an external ground via disposed proximate to and adjacent at least one side edge of the plurality of capacitor top plates, wherein the grounded top metal layer is electrically coupled to the external ground via.

2. The integrated MIS shunt capacitor of claim 1, wherein the bottom electrode includes a doped epitaxial layer overlying a bulk semiconductor substrate, further overlying a back metal of the substrate.

3. The integrated MIS shunt capacitor of claim 2, wherein the doped epitaxial layer comprises a heavily doped sinker and P+ enhanced implant region.

4. The integrated MIS shunt capacitor of claim 1, wherein the capacitor dielectric comprises a patterned capacitor dielectric that overlies the bottom electrode in regions underlying each of the plurality of individual capacitor top plates alone.

5. The integrated MIS shunt capacitor of claim 1, wherein the capacitor top plates of the plurality of capacitor top plates comprise similar capacitor top plates.

6. The integrated MIS shunt capacitor of claim 5, further wherein the capacitor top plates of the plurality of capacitor top plates comprise a portion of which are dissimilar to other ones of the capacitor top plates.

7. The integrated MIS shunt capacitor of claim 6, still further wherein dissimilar ones of the capacitor top plates each include at least one bend in the capacitor top plate along its corresponding principal dimension, wherein a bend corresponds to the principal dimension traversing along more than one direction.

8. The integrated MIS shunt capacitor of claim 1, wherein each capacitor top plate is characterized as having a given periphery, further wherein the plurality of capacitor top plates are configured to provide for a given cumulative capacitance value, and still further wherein the capacitor top plates of the plurality taken together collectively form a large periphery capacitor which occupy an area having an area periphery on the order of a capacitor top plate periphery for a single capacitor top plate MIS shunt capacitor of an equivalent capacitance value, the single capacitor top plate MIS shunt capacitor thereby comprising a small periphery capacitor in comparison to the large periphery capacitor of the plurality of capacitor top plates.

9. The integrated MIS shunt capacitor of claim 1, wherein a single conductive stripe is shared between adjacent ones of the plurality of capacitor top plates except for first and last conductive stripes positioned before a first of the plurality of capacitor top plates and a last of the plurality of capacitor top plates, respectively.

10. The integrated MIS shunt capacitor of claim 1, wherein the plurality of conductive stripes electrically coupled between the bottom electrode and the grounded top metal layer provide for a shortest lateral path to ground of any point in a region of the bottom electrode underlying a given capacitor top plate of the plurality of capacitor top plates.

11. The integrated MIS shunt capacitor of claim 10, further wherein the shortest lateral path to ground comprises a distance on the order of less or equal to fifty percent of a lateral distance across the bottom electrode spanning from a first capacitor top plate of the plurality to a last capacitor top plate of the plurality.

12. The integrated MIS shunt capacitor of claim 1, wherein a portion of the plurality of capacitor top plates not underlying the grounded top metal layer is available for electrical connection to the plurality of capacitor top plates, the integrated MIS shunt capacitor further comprising:
 a contact top metal layer electrically coupled to the plurality of capacitor top plates.

13. The integrated MIS shunt capacitor of claim 1, wherein the capacitor top plates and the contact stripes are formed of a first metal, and wherein the external ground via and grounded top metal are formed of a second metal.

14. The integrated MIS shunt capacitor of claim 1 wherein the external ground via includes a doped epitaxial layer overlying a bulk semiconductor substrate, further overlying back metal of the substrate.

15. The integrated MIS shunt capacitor of claim 14, wherein the external ground via surrounds three side edges of the plurality of capacitor top plates, collectively.

16. The integrated MIS shunt capacitor of claim 15, wherein the doped epitaxial layer comprises a heavily doped sinker and P+ enhanced implant region.

17. The integrated MIS shunt capacitor of claim 1, further comprising:
 a silicide disposed in between the capacitor dielectric and the bottom electrode.

18. The integrated MIS shunt capacitor of claim 1, wherein the integrated MIS shunt capacitor comprises a portion of a matching network for an integrated power amplifier device.

19. An integrated metal-insulator-semiconductor (MIS) shunt capacitor comprising:
 a bottom electrode;
 a capacitor dielectric overlying the bottom electrode;
 a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates;
 a plurality of conductive stripes, wherein at least one conductive stripe is positioned on opposite sides of each capacitor top plate along the principal dimension of a respective capacitor top plate;
 a grounded top metal layer overlying a portion of the plurality of capacitor top plates, wherein each of the plurality of conductive stripes is coupled between the bottom electrode and the grounded top metal layer;
 an inter-level dielectric, wherein the inter-level dielectric is configured to (i) isolate the plurality capacitor top plates from the grounded top metal layer, and (ii) isolate the plurality of conductive stripes from adjacent ones of the plurality of capacitor top plates; and
 an external ground via disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via,
 wherein each capacitor top plate is characterized as having a given periphery, further wherein the plurality of capacitor top plates are further configured to provide for a given cumulative capacitance value, and still further wherein the capacitor top plates of the plurality taken together collectively form a large periphery capacitor which occupy an area having an area periphery on the order of a capacitor top plate periphery for a single capacitor top plate MIS shunt capacitor of an equivalent capacitance value, the single capacitor top plate MIS shunt capacitor thereby comprising a small periphery capacitor in comparison to the large periphery capacitor of the plurality of capacitor top plates.

20. An integrated metal-insulator-semiconductor (MIS) shunt capacitor comprising:
 a bottom electrode;
 a capacitor dielectric overlying the bottom electrode;
 a plurality of capacitor top plates overlying the capacitor dielectric, each capacitor top plate having a principal dimension and a lesser dimension, wherein individual capacitor top plates of the plurality are arranged proximate and adjacent to one another in an array along respective principal dimensions thereof, and further wherein the bottom electrode is shared among the plurality of capacitor top plates;
 a plurality of conductive stripes, wherein at least one conductive stripe is positioned on opposite sides of each capacitor top plate along the principal dimension of a respective capacitor top plate;
 a grounded top metal layer overlying a portion of the plurality of capacitor top plates, wherein each of the plurality of conductive stripes is coupled between the bottom electrode and the grounded top metal layer;
 an inter-level dielectric, wherein the inter-level dielectric is configured to (i) isolate the plurality capacitor top plates from the grounded top metal layer, and (ii) isolate the plurality of conductive stripes from adjacent ones of the plurality of capacitor top plates;

an external ground via disposed proximate to and adjacent at least one side edge of the plurality of capacitor top plates, wherein the external ground via includes a doped epitaxial layer overlying the bulk semiconductor substrate, further overlying the back metal of the substrate, and wherein the grounded top metal layer is electrically coupled to the external ground via, wherein a portion of the plurality of capacitor top plates not underlying the grounded top metal layer is available for electrical connection to the plurality of capacitor top plates; and a contact top metal layer electrically coupled to the plurality of capacitor top plates, wherein a single conductive stripe is shared between adjacent ones of the plurality of capacitor top plates except for first and last conductive stripes positioned before a first of the plurality of capacitor top plates and a last of the plurality of capacitor top plates, respectively, further wherein the plurality of conductive stripes electrically coupled between the bottom electrode and the grounded top metal layer provide for a shortest lateral path to ground of any point in a region of the bottom electrode underlying a given capacitor top plate of the plurality of capacitor top plates, and still further wherein the shortest lateral path to ground comprises a distance on the order of less or equal to fifty percent of a lateral distance across the bottom electrode spanning from a first capacitor top plate of the plurality to a last capacitor top plate of the plurality.

* * * * *